US011770966B2

(12) United States Patent
Kang et al.

(10) Patent No.: US 11,770,966 B2
(45) Date of Patent: Sep. 26, 2023

(54) METHOD OF MANUFACTURING DISPLAY DEVICE INCLUDING A FORMATION PROCESS OF A CONDUCTIVE FILM AND LASER CURING THE CONDUCTIVE FILM AND MANUFACTURING DEVICE FOR DISPLAY DEVICE

(71) Applicant: SAMSUNG DISPLAY CO., LTD., Yongin-si (KR)

(72) Inventors: Eui Jeong Kang, Suwon-si (KR); Si Joon Song, Suwon-si (KR); Byoung Yong Kim, Seoul (KR); Dae Hyuk Im, Daegu (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/956,096

(22) Filed: Sep. 29, 2022

(65) Prior Publication Data

US 2023/0015414 A1   Jan. 19, 2023

Related U.S. Application Data

(62) Division of application No. 16/895,360, filed on Jun. 8, 2020, now Pat. No. 11,508,946.

(30) Foreign Application Priority Data

Sep. 2, 2019  (KR) .................. 10-2019-0108371

(51) Int. Cl.
*H10K 71/00* (2023.01)
*H10K 50/844* (2023.01)
(Continued)

(52) U.S. Cl.
CPC ........... *H10K 71/00* (2023.02); *H10K 50/844* (2023.02); *H10K 59/131* (2023.02); *H10K 59/1201* (2023.02)

(58) Field of Classification Search
CPC . H01L 27/3276; H01L 51/5253; H01L 51/56; H01L 2227/323; H10K 50/844;
(Continued)

(56) References Cited

U.S. PATENT DOCUMENTS

2017/0358602 A1 * 12/2017 Bae .................. H05K 1/117
2021/0066443 A1   3/2021 Kim
2021/0066674 A1   3/2021 Kang et al.

FOREIGN PATENT DOCUMENTS

KR     10-2006-0101711       9/2006
KR     20060101711 A   *   9/2006   .............. H01J 9/32
(Continued)

*Primary Examiner* — Matthew E. Gordon
(74) *Attorney, Agent, or Firm* — F. Chau & Associates, LLC

(57) ABSTRACT

A method of manufacturing a display device includes: providing a first substrate, a second substrate, and a plurality of connection lines, wherein the first substrate has a base substrate, wherein the second substrate faces the first substrate, and wherein the plurality of connection lines are disposed between the base substrate and the second substrate; grinding a side surface of the base substrate, a side surface of the second substrate, and side surfaces of the plurality of connection lines; and simultaneously transferring a conductive film and laser-curing the conductive film, wherein the conductive film is transferred to the ground side surface of the base substrate, the ground side surface of the second substrate, and the ground side surfaces of the plurality of connection lines.

5 Claims, 17 Drawing Sheets

(51) Int. Cl.
*H10K 59/131* (2023.01)
*H10K 59/12* (2023.01)

(58) Field of Classification Search
CPC .. H10K 59/12; H10K 59/1201; H10K 59/131;
H10K 59/873; H10K 71/00; H10K 71/40;
H10K 71/421; H10K 71/441
USPC .......................................................... 257/40
See application file for complete search history.

(56) References Cited

FOREIGN PATENT DOCUMENTS

| KR | 10-2015-0074275 | | 7/2015 | | |
|----|-----------------|---|--------|---|---|
| KR | 20150074275 A | * | 7/2017 | ........... | G02F 1/1303 |
| KR | 10-2017-0135529 | | 12/2017 | | |
| KR | 20170135529 A | * | 12/2017 | ............. | G01N 21/88 |

* cited by examiner

FIG.13
| | Thermal transfer using hot metal tool | Laser transfer using quartz tool | Notes |
|---|---|---|---|
| Images | 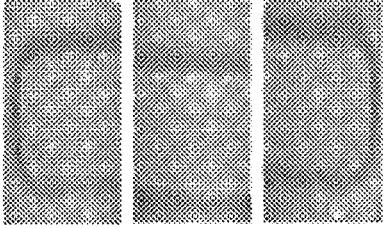 | 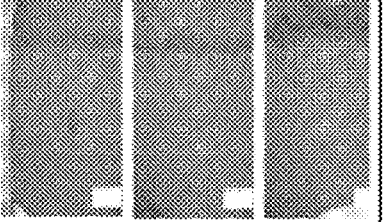 | OK |
| Specifications | Transfer<br>    Tool temperature: 100 °C<br>    Pressure: 2 kgf<br>    Time: 10s<br>Curing<br>    Output: 20.6 W<br>    Speed: 15 mm/s (4s) | Transfer and curing<br><br>    Pressure: 2 kgf<br>    Output: 35 W<br>    Time: 5s | |

METHOD OF MANUFACTURING DISPLAY DEVICE INCLUDING A FORMATION PROCESS OF A CONDUCTIVE FILM AND LASER CURING THE CONDUCTIVE FILM AND MANUFACTURING DEVICE FOR DISPLAY DEVICE

CROSS-REFERENCE TO RELATED APPLICATIONS

This application is a divisional of U.S. patent application Ser. No. 16/895,360 filed on Jun. 8, 2020, which claims priority under 35 U.S.C § 119 to Korean Patent Application No. 10-2019-0108371 filed on Sep. 2, 2019 in the Korean Intellectual Property Office, the disclosures of which are incorporated by reference herein in their entireties.

TECHNICAL FIELD

The present invention relates to a manufacturing device for a display device and a method of manufacturing a display device.

DISCUSSION OF THE RELATED ART

Display devices, which display moving images and still images, may not only be used in portable electronic devices, such as mobile phones, smartphones, tablet personal computers (PCs), smart watches, watch phones, mobile communication terminals, electronic notebooks, electronic books, portable multimedia players (PMPs), navigation devices, ultra-mobile PCs (UMPCs), and the like, but ay also be used as display screens for various products such as televisions (TVs), laptop computers, monitors, billboards, and Internet of Things (IoT) devices, and the like.

To drive light-emitting devices of a display device, a printed circuit board (PCB) including driver circuits, a plurality of lead lines which electrically connect the light-emitting devices, and a plurality of lead lines connected to the plurality of signal lines may be used. The display device may include a display region, which displays images, and a portion (e.g., a bezel), which surrounds the display region and does not display the images. Generally, to realize a bezel-less display device, the signal lines and the lead lines may be side-bonded to a side surface of the display device.

SUMMARY

According to an exemplary embodiment of the present invention, a method of manufacturing a display device includes: providing a first substrate, a second substrate, and a plurality of connection lines, wherein the first substrate has a base substrate, wherein the second substrate faces the first substrate, and wherein the plurality of connection lines are disposed between the base substrate and the second substrate; grinding a side surface of the base substrate, a side surface of the second substrate, and side surfaces of the plurality of connection lines; and simultaneously transferring a conductive film and laser-curing the conductive film, wherein the conductive film is transferred to the ground side surface of the base substrate, the ground side surface of the second substrate, and the ground side surfaces of the plurality of connection lines.

In an exemplary embodiment of the present invention, the transferring of the conductive film includes forming the conductive film on the ground side surface of the base substrate, the ground side surface of the second substrate, and the ground side surfaces of the plurality of connection lines, and compressing the conductive film.

In an exemplary embodiment of the present invention, the compressing of the conductive film is performed using a transparent compression tool disposed on the conductive film.

In an exemplary embodiment of the present invention, the transparent compression tool includes quartz or glass.

In an exemplary embodiment of the present invention, the laser-curing of the conductive film is performed with a projection of laser beams passing through the transparent compression tool.

In an exemplary embodiment of the present invention, the laser-curing of the conductive film is performed using a continuous-wave laser supply device.

In an exemplary embodiment of the present invention, during the laser-curing of the conductive film, the laser beams are focused at a front surface of the conductive film.

In an exemplary embodiment of the present invention, during the laser-curing of the conductive film, the laser beams are focused at a region of the conductive film, and the laser-curing is performed while changing a focal position of the laser beams.

In an exemplary embodiment of the present invention, the conductive film includes: a conductive layer disposed on the ground side surface of the base substrate, the ground side surface of the second substrate, and the ground side surfaces of the plurality of connection lines; and a protective layer disposed on the conductive layer.

In an exemplary embodiment of the present invention, the method further includes delaminating the protective layer from one surface of the conductive layer after the transferring and the laser-curing of the conductive film.

In an exemplary embodiment of the present invention, the method further includes patterning the conductive layer and forming a plurality of connection pads disposed separately from each other in one direction after the delaminating of the protective layer from the one surface of the conductive layer.

In an exemplary embodiment of the present invention, the method further includes bonding a printed circuit board onto the plurality of connection pads after the forming of the plurality of connection pads.

In an exemplary embodiment of the present invention, the bonding of the printed circuit board onto the plurality of connection pads includes arranging the printed circuit board on the plurality of connection pads and simultaneously compressing the arranged printed circuit board and laser-bonding the printed circuit board to the plurality of connection pads, wherein the compressing of the arranged printed circuit board is performed using a transparent compression tool disposed on the printed circuit board.

In an exemplary embodiment of the present invention, the laser-bonding of the printed circuit board to the plurality of connection pads is performed with a projection of laser beams passing through the transparent compression tool, wherein the laser-bonding of the printed circuit board to the plurality of connection pads includes curing an anisotropic conductive film disposed between lead lines of the printed circuit board and the connection pads.

In an exemplary embodiment of the present invention, during the simultaneously transferring and laser-curing of the conductive film on the ground side surface of the base substrate, the ground side surface of the second substrate, and the ground side surfaces of the plurality of connection lines, the conductive film extends to a first surface of the base substrate, and the transferring and laser-curing of the conductive film is performed on the first surface of the base substrate.

According to an exemplary embodiment of the present invention, a manufacturing device for a display device including: a grinder configured to grind a side surface of a base substrate, a side surface of a second substrate, and side surfaces of a plurality of connection lines disposed between the base substrate and the second substrate; and a conductive-film transfer unit and a conductive-film curing unit configured to simultaneously transfer a conductive film to and laser-cure the conductive film on the ground side surface of the base substrate, the ground side surface of the second substrate, and the ground side surfaces of the plurality of connection lines. The conductive film includes a conductive layer and a protective layer disposed on the conductive layer.

In an exemplary embodiment of the present invention, the conductive-film transfer unit compresses the conductive film formed on the ground side surface of the base substrate, the ground side surface of the second substrate, and the ground side surfaces of the plurality of connection lines.

In an exemplary embodiment of the present invention, the conductive-film transfer unit includes a compression tool disposed on the conductive film, and the compression tool includes quartz or glass.

In an exemplary embodiment of the present invention, the conductive-film curing unit includes a first laser supply device, wherein the first laser supply device projects continuous-wave laser beams through the compression tool and cures the conductive film.

In an exemplary embodiment of the present invention, the device further including: a patterning laser configured to pattern the conductive layer and form connection pads; and a chip-on film bonding unit configured to bond a printed circuit board onto the connection pads, wherein the chip-on film bonding unit includes: a compression unit configured to compress a chip-on film and including a compression tool including quartz or glass; and a second laser supply device configured to project laser beams through the compression unit and to cure an anisotropic conductive film disposed between lead lines of the printed circuit board and the connection pads.

BRIEF DESCRIPTION OF THE DRAWINGS

The above and other features of the present disclosure will become more apparent by describing exemplary embodiments thereof in detail with reference to the accompanying drawings, in which:

FIG. 13 is a table showing comparisons between simultaneous operations of transferring a conductive film and laser-curing the conductive film and sequential operations of transferring a conductive film and laser-curing the conductive film;

DETAILED DESCRIPTION OF THE EMBODIMENTS

Figure 1:
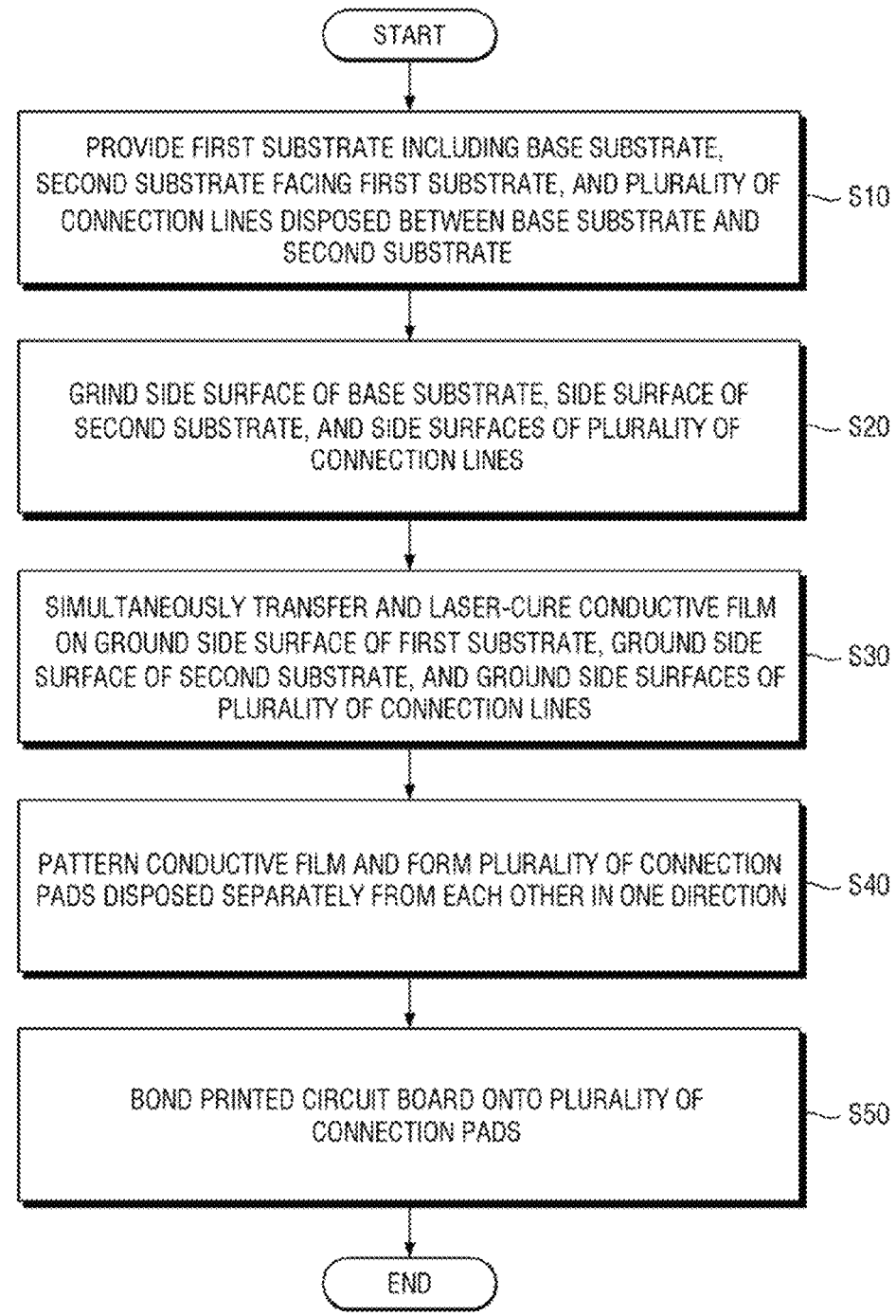
FIG. 1 is a flowchart illustrating a method of manufacturing a display device according to an exemplary embodiment of the present invention.

Exemplary embodiments of the present invention will now be described more fully hereinafter with reference to the accompanying drawings. This present invention may, however, be embodied in different forms and should not be construed as limited to the exemplary embodiments set forth herein.

It will be understood that when an element or layer is referred to as being "above" or "on" another element or layer, the element or layer can be directly on another element or layer or intervening layers or elements may be present therebetween.

The same reference numerals may denote the same elements throughout the specification, and thus repetitive descriptions may be omitted.

Hereinafter, exemplary embodiments of the present invention will be described with reference to the accompanying drawings.

Figure 6:
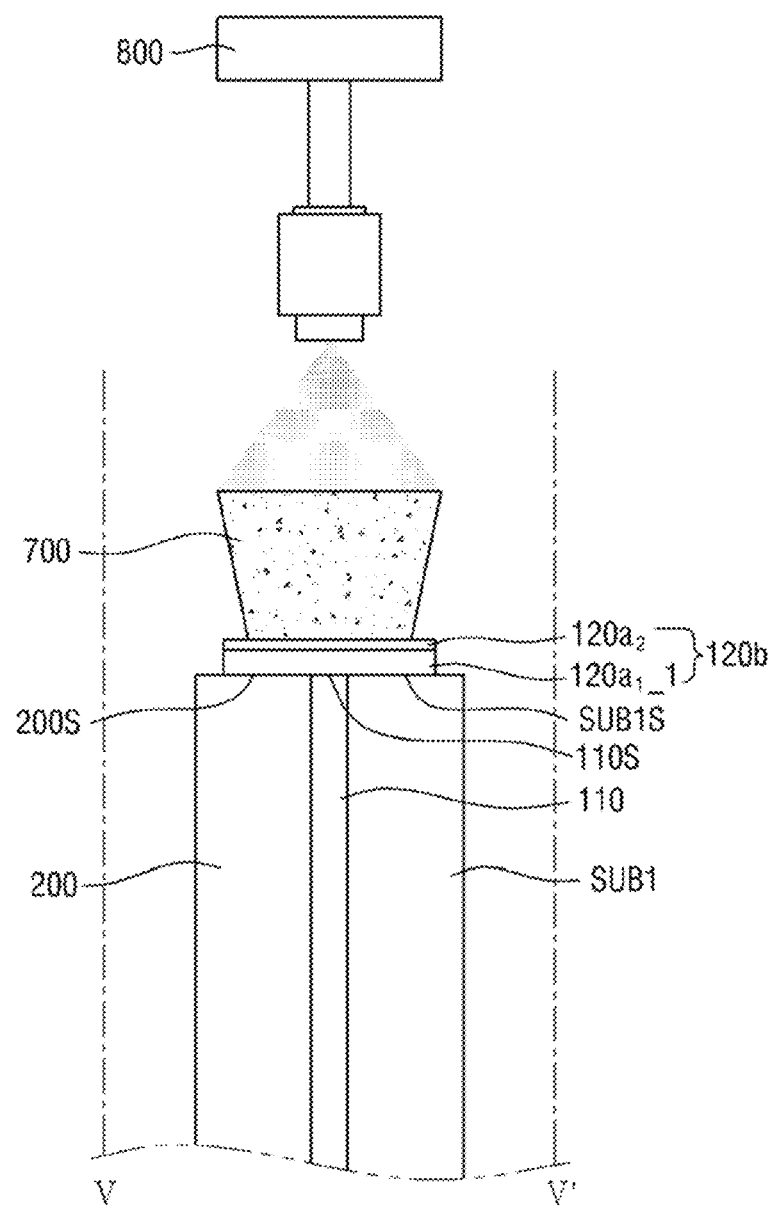
FIG. 6 is a cross-sectional view taken along line V-V' of FIG. 5.
Figure 7:
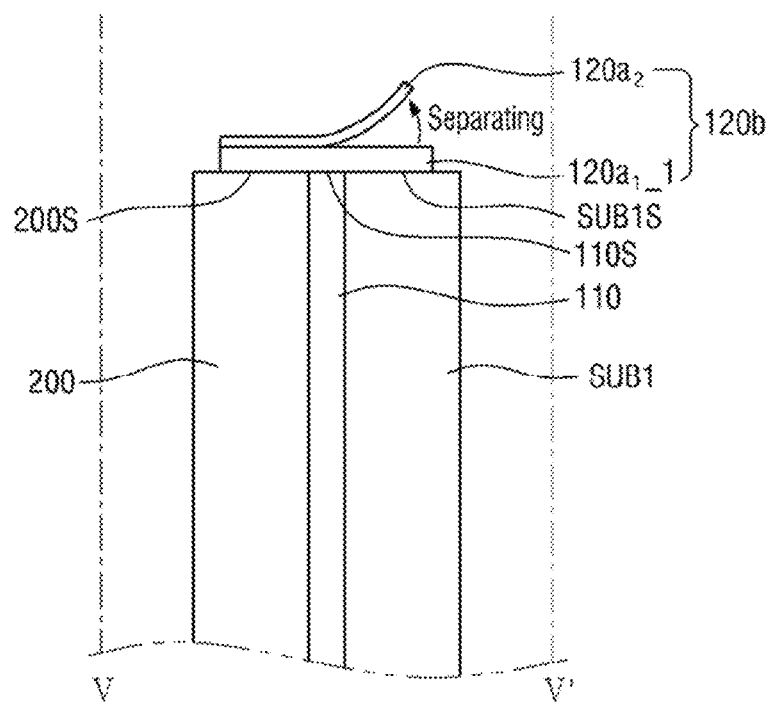
FIG. 7 is a cross-sectional view illustrating the delamination of a protective film shown in FIG. 6.
Figure 11:
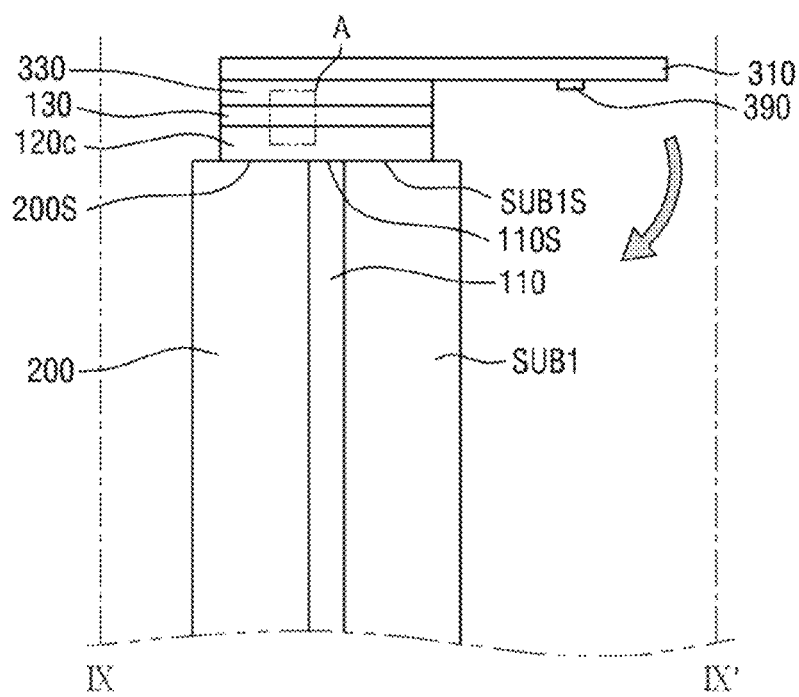
FIG. 11 is a cross-sectional view taken along line IX-IX' of FIG. 9.
Figure 12:
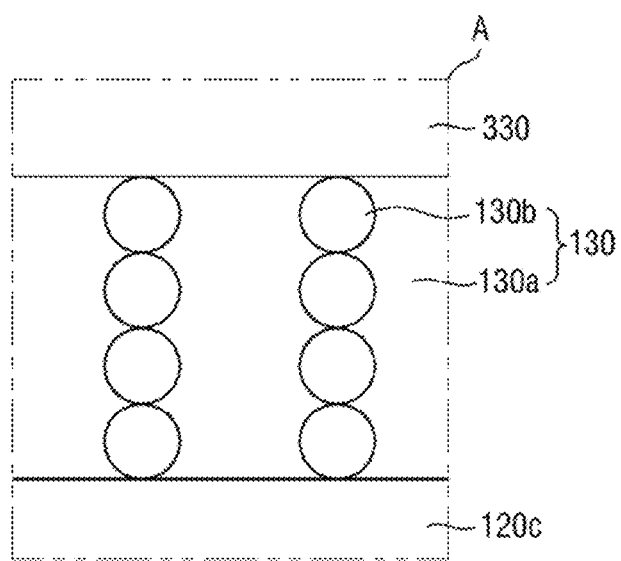
FIG. 12 is an enlarged cross-sectional view of region A of FIG. 11.

FIG. 1 is a flowchart illustrating a method of manufacturing a display device according to an exemplary embodiment of the present invention. FIGS. 2, 3, 5, 8, and 10 are perspective views illustrating process operations of a method of manufacturing a display device according to an exemplary embodiment of the present invention. FIG. 4 is a cross-sectional view taken along line IV-IV' of FIG. 3. FIG. 6 is a cross-sectional view taken along line V-V' of FIG. 5. FIG. 7 is a cross-sectional view illustrating the delamination of a protective film shown in FIG. 6. FIG. 9 is a cross-sectional view taken along line VII-VII' of FIG. 8. FIG. 11 is a cross-sectional view taken along line IX-IX' of FIG. 9. FIG. 12 is an enlarged cross-sectional view of region A of FIG. 11.

Referring to FIGS. 1 to 12, the method of manufacturing a display device according to the exemplary embodiment of the present invention may include providing a first substrate including a base substrate, a second substrate facing the first substrate, and a plurality of connection lines disposed between the base substrate and the second substrate (S10). The method of manufacturing the display device may further include grinding a side surface of the base substrate, a side surface of the second substrate, and side surfaces of the plurality of connection lines (S20), and simultaneously transferring a conductive film onto the ground side surface of the base substrate, the ground side surface of the second substrate, and the ground side surfaces of the plurality of connection lines and laser-curing the conductive film (S30). The method further includes patterning the conductive film to form a plurality of connection pads disposed separately from each other in one direction (S40), and bonding a printed circuit board (PCB) on the plurality of connection pads (S50).

Figure 2:
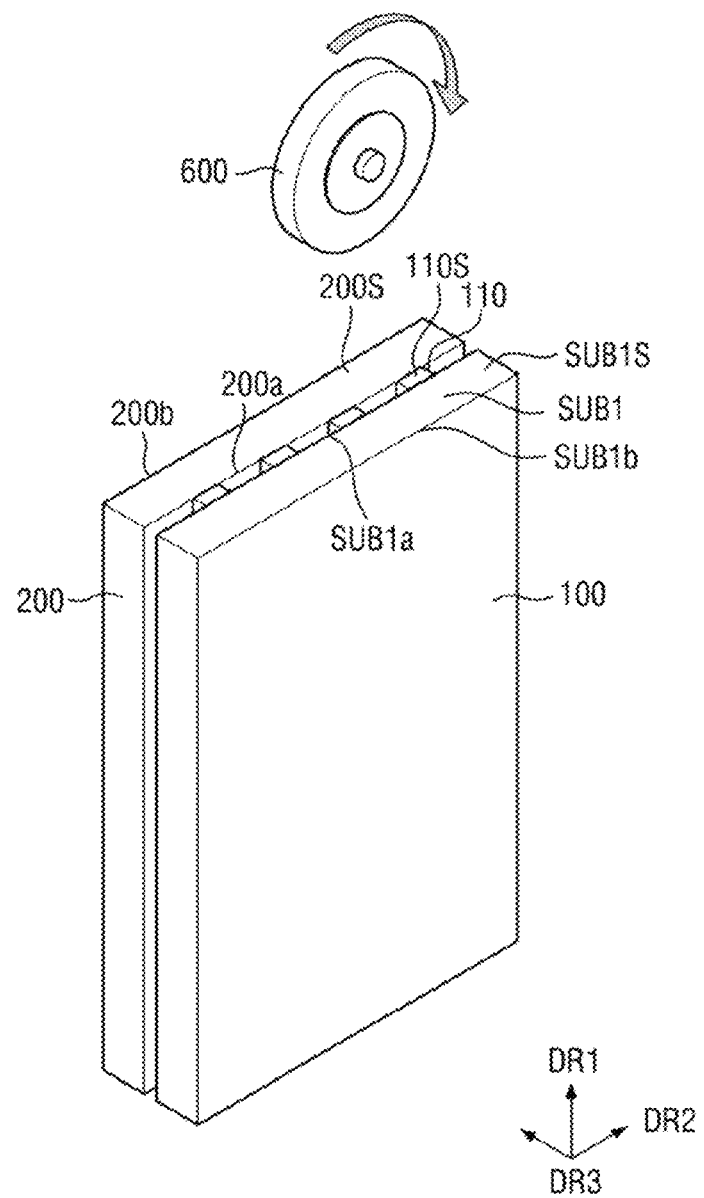
FIGS. 2, 3, 5, 8, and 10 are perspective views illustrating process operations of a method of manufacturing a display device according to an exemplary embodiment of the present invention.

Referring to FIGS. 1 and 2, a first substrate 100, a second substrate 200 facing the first substrate 100, and a plurality of connection lines 110. In addition, the first substrate 100 includes a first base substrate SUB1, and the plurality of connection lines 110 are disposed between the first base substrate SUB1 and the second substrate 200 may be provided (S10).

The display device according to an exemplary embodiment of the present invention may include target panels 100 and 200.

The target panels 100 and 200 may respectively include the first substrate 100 and the second substrate 200. In addition, the target panels 100 and 200 may respectively include various elements disposed on the first substrate 100 and various elements disposed on the second substrate 200.

In an exemplary embodiment of the present invention, the target panels 100 and 200 may respectively be the first substrate 100 and the second substrate 200.

The target panels 100 and 200 may each include, for example, an organic light-emitting display panel. Although the following embodiments illustrate a case in which the target panels 100 and 200 each include the organic light-emitting display panel, the present invention is not limited thereto. For example, the target panels 100 and 200 may include other kinds of display panels such as a liquid crystal display (LCD), a quantum-dot organic light emitting diode (QD-OLED) panel, a quantum-dot LCD (QD-LCD), a quantum nano light-emitting diode (nano LED) panel, and a micro LED.

The various elements of the first substrate 100 may include a plurality of insulating layers, a plurality of conductive layers, at least one thin-film transistor (TFT), and an organic light-emitting element connected to the at least one TFT.

For example, the first substrate 100 may be a back plate substrate including the at least one TFT or a TFT substrate.

The second substrate 200 may face the first substrate 100 and disposed over the first substrate 100. The second substrate 200 may include an encapsulation substrate which encapsulates the organic light-emitting element of the first substrate 100.

Each of the first substrate 100 and the second substrate 200 may include a base substrate. Each of the base substrates of the first substrate 100 and the second substrate 200 may include a rigid material such as glass or quartz. For example, the first substrate 100 may include a first base substrate SUB1.

The first substrate 100 may further include the connection lines 110 disposed between the first base substrate SUB1 and the second substrate 200.

The target panels 100 and 200 may each have a rectangular shape of which corners are a right angle in a plan view. However, the present invention is not limited thereto; for example, the target panels 100 and 200 may each have a polygonal shape and may have rounded corners. The target panels 100 and 200 may each have long sides and short sides in a plan view. The short sides of the target panels 100 and 200 may be sides extending in a second direction DR2. The long sides of the target panels 100 and 200 may be sides extending in a first direction DR1. The first substrate 100 may have substantially the same planar shape as the second substrate 200.

Thereafter, referring to FIGS. 1 and 2, one (e.g., first) side surface SUB1s of the first base substrate SUB1, one (e.g., first) side surface 200s of the second substrate 200, and side surfaces (e.g., first side surfaces) 110s of the plurality of connection lines 110 may be ground (S20).

As a result, side surface portions (e.g., upper short side surface portions in a first direction DR1) of the first substrate 100 and the second substrate 200 may be ground, and thus one side surface of the first substrate 100 and one side surface 200S of the second substrate 200 may be arranged in a direction (e.g., a third direction DR3) in which the second substrate 200 is viewed from the first substrate 100. Regarding other side surface portions (lower short side surface portions in the first direction DR1 and extending in the second direction DR2, first long side surface portions of one side in a second direction DR2 and extending in the first direction DR1, and second long side surface portions of the other side (e.g., opposing the first long side surface portions) in the second direction DR2 and extending in the first direction DR1) of the first substrate 100 and the second substrate 200, side surfaces of the first substrate 100 and the second substrate 200 may be arranged in a thickness direction (e.g., the third direction DR3), but the present invention is not limited thereto.

Hereinafter, the ground one side surface of the first substrate 100 and the ground one side surface 200s of the second substrate 200 will be respectively referred to as a first side surface of the first substrate 100 and a first side surface of the second substrate 200.

The connection lines 110 may pass from a display region of the first substrate 100 through a non-display region (or, e.g., an upper short side surface of the first substrate 100 in the first direction DR1). However, the present invention is not limited thereto, and for example, the connection lines 110 may extend from the display region of the first substrate 100 to a long side surface of the first substrate 100. The connection line 110 may be electrically connected to a pixel of the display region. The connection line 110 may extend to the first side surface of the first substrate 100 and the first side surface 200s of the second substrate 200, and thus, the first side surface 110s of the connection line 110 and the first side surface of the first substrate 100 and the first side surface 200s of the second substrate 200 may be arranged in a thickness direction. In other words, the first substrate 100, the connection lines 110, and the second substrate 200 are arranged in the third direction DR3.

Like the first substrate 100 including the first side surface, the first base substrate SUB1 of the first substrate 100 may include the first side surface SUB1s. For example, the first side surface SUB1s may be a part of the first side surface of the first substrate 100. The first side surface SUB1s of the first base substrate SUB1, the first side surface 110s of the connection line 110, and the first side surface 200s of the second substrate 200 may be arranged with each other in the third direction DR3.

A plurality of connection lines 110 may be provided. The plurality of connection lines 110 may be disposed to be spaced apart from each other in the second direction DR2. Although only four connection lines 110 are illustrated, five or more connection lines 110 may be provided.

The connection line 110 may include at least one metal such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

Like the first side surface of the first substrate 100, the connection line 110 disposed on the first substrate 100 may include the first side surface 110s. The first side surface 110s of the connection line 110 and the first side surface 200s of the second substrate 200 may be arranged with each other in the third direction DR3.

Like the first substrate 100 including the first side surface, the first base substrate SUB1 of the first substrate 100 may include the first side surface SUB1s. The first side surface 110s of the connection line 110, the first side surface 200s of the second substrate 200, and the first side surface SUB1s of the first base substrate SUB1 may be arranged with each other in the third direction DR3.

Operation S20 of grinding one side surface SUB1s of the first base substrate SUB1, one side surface 200s of the second substrate 200, and the first side surfaces 110s of the plurality of connection lines 110 may be performed using a grinding device 600 shown in FIG. 2. The grinding device 600 may be disposed on one side surface SUB1s of the first base substrate SUB1, one side surface 200s of the second substrate 200, and the side surfaces 110s of the plurality of connection lines 110, and may grind one side surface SUB1s is of the first base substrate SUB1, one side surface 200s of the second substrate 200, and the side surfaces 110s of the plurality of connection lines 110 while moving in one direction. The grinding device 600 may include, for example, a wheel device. The wheel device may have a circular planar shape based on the plane formed by the first direction DR1 and the second direction DR2. For example, a side surface of the grinding device 600 may be parallel to the first side surface SUB1s of the first base substrate SUB1, the first side surface 200s of the second substrate 200, and the first side surfaces 110s of the plurality of connection lines 110. The wheel device having a circular planar shape may have a central shaft facing the second direction DR2 and circularly rotate to grind one side surface SUB1s is of the first base substrate SUB1, one side surface 200s of the second substrate 200, and the side surfaces 110s of the plurality of connection lines 110. For example, the central shaft may extend in the second direction DR2.

The first base substrate SUB1 may include a first surface SUB1a facing the second substrate 200 and a second surface SUB1b opposite to the first surface SUB1a of the first base substrate SUB1. The second substrate 200 may include a first surface 200a facing the first substrate 100 and a second surface 200b opposite to the first surface 200a.

Thereafter, referring to FIGS. 1 and 3 to 6, a conductive film 120a may be simultaneously transferred to the ground first side surface of the first substrate 100, the ground first side surface 200s of the second substrate 200, and the ground first side surfaces 110s of the plurality of connection lines 110, and a laser curing process may be performed (S30). For example, the conductive film 120a may be transferred to the ground first side surface SUB1s of the base substrate SUB1.

Figure 3:
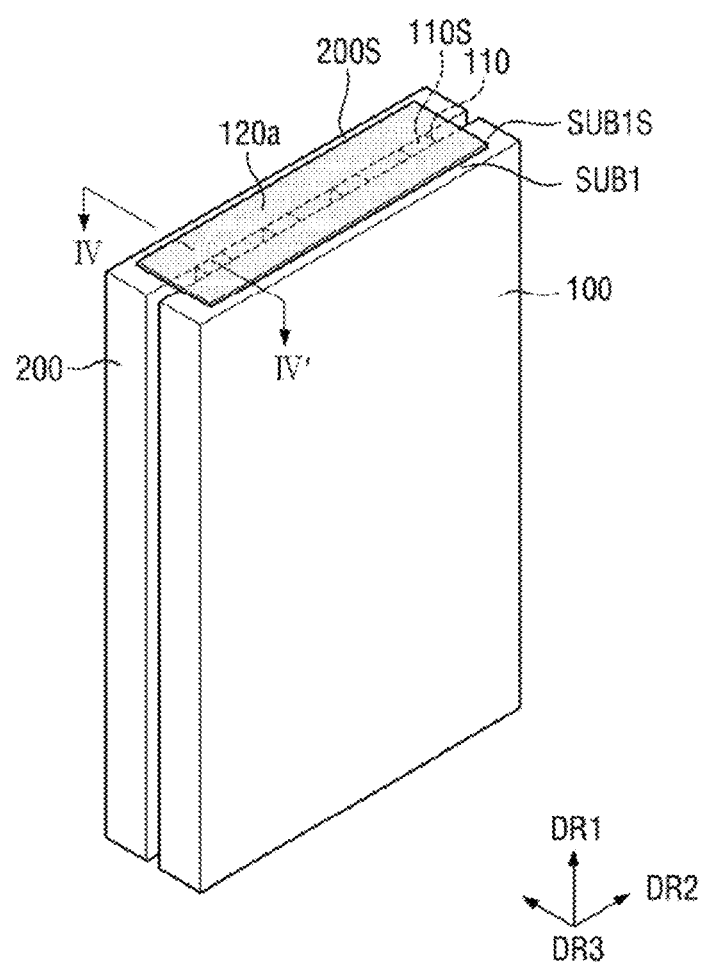
Figure 4:
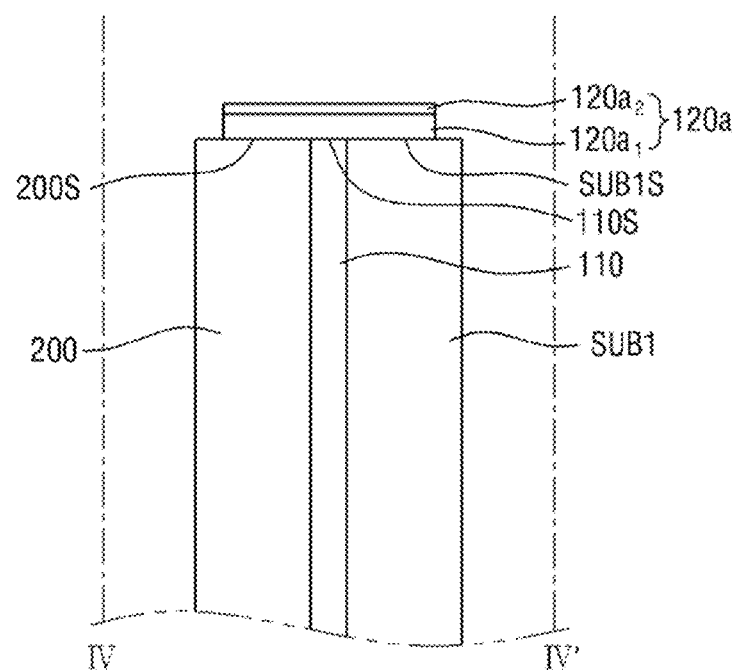
FIG. 4 is a cross-sectional view taken along line IV-IV' of FIG. 3.

As shown in FIG. 3, the operation of transferring the conductive film 120a to the ground first side surface of the first substrate 100, the ground first side surface 200s of the second substrate 200, and the ground first side surfaces 110s of the plurality of connection lines 110 may include arranging the conductive film 120a on the ground first side surface of the first substrate 100, the ground first side surface 200s of the second substrate 200, and the ground first side surfaces 110s of the plurality of connection lines 110.

As shown in FIG. 4, the conductive film 120a may include a conductive layer $120a_1$ and a protective layer $120a_2$ disposed on the conductive layer $120a_1$. Before the conductive film 120a is arranged on the ground first side surface of the first substrate 100 (e.g., the ground first side surface SUB1s of the first base substrate SUB1), the ground first side surface 200s of the second substrate 200, and the ground first side surfaces 110s of the plurality of connection lines 110, the conductive film 120a may further include a release film, which is spaced apart from the protective layer $120a_2$ with the conductive layer $120a_1$ disposed therebetween. For example, the release film may be disposed on a bottom surface of the conductive layer $120a_1$. When the release film is arranged on the ground first side surface of the first substrate 100, the ground first side surface 200s of the second substrate 200, and the ground first side surfaces 110s of the plurality of connection lines 110, the release film may be delaminated and removed from the conductive layer $120a_1$.

The conductive layer $120a_1$ may be disposed on the first side surface of the first substrate 100, the first side surface 200s of the second substrate 200, and the first side surfaces 110s of the plurality of connection lines 110. The conductive layer $120a_1$ may be directly disposed on the first side surface of the first substrate 100, the first side surface 200s of the second substrate 200, and the first side surfaces 110s of the plurality of connection lines 110. As an additional example, the conductive layer $120a_1$ may be disposed on the first side surface SUB1s of the first base substrate SUB1. The conductive layer $120a_1$ may include a conductive material. The conductive material may include at least one of silver (Ag), copper (Cu), and/or gold (Au). The conductive layer $120a_1$ according to an exemplary embodiment of the present invention may include silver.

The conductive film 120a may be formed over the entire surfaces on the ground first side surface of the first substrate 100, the ground first side surface 200s of the second substrate 200, and the ground first side surfaces 110s of the plurality of connection lines 110. As an additional example, the conductive layer $120a_1$ may be formed over the ground first side surface SUB1s of the first base substrate SUB1.

The protective layer $120a_2$ may include a material that may be typically used as a base material. The protective layer $120a_2$ may include, for example, polyethylene terepthalate (PET), but the present invention is not limited thereto.

Figure 5:
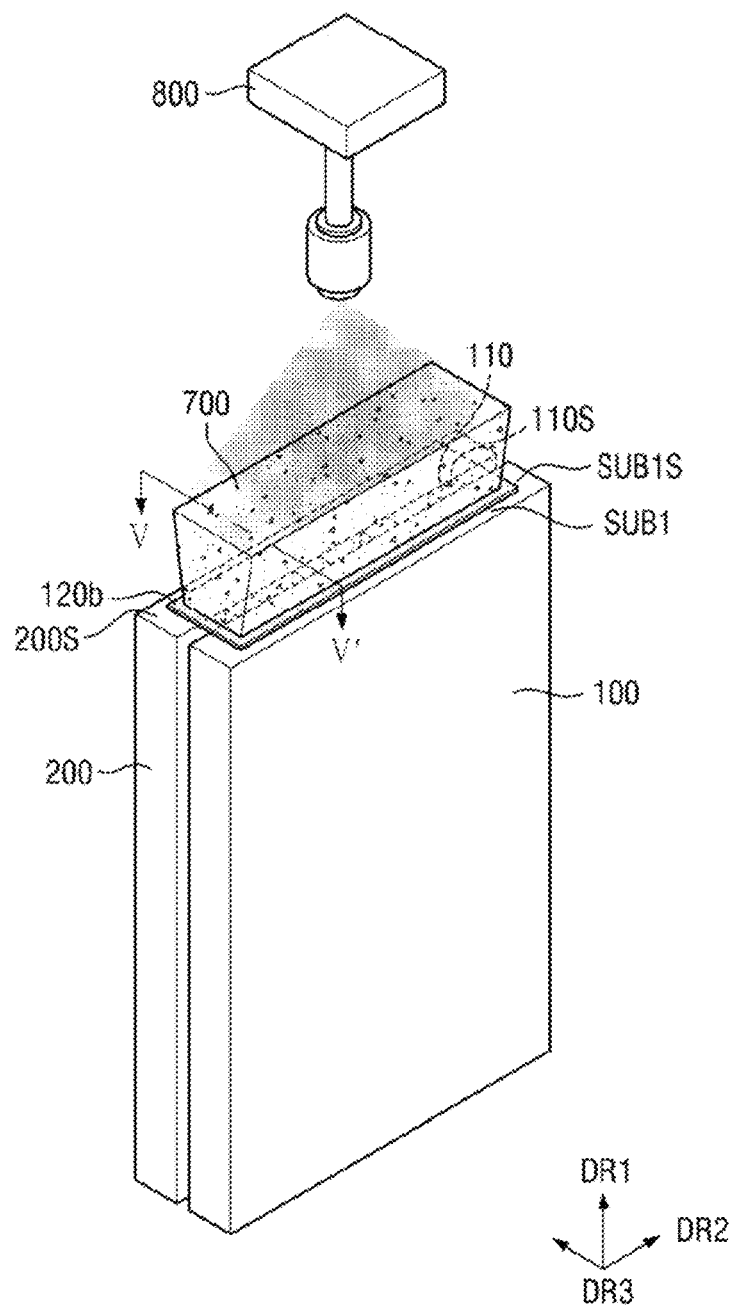

Referring to FIG. 5, an operation of transferring a conductive film 120a to the ground first side surface of the first substrate 100, the ground first side surface 200s of the second substrate 200, and the ground first side surfaces 110s of the plurality of connection lines 110 may further include compressing the conductive film 120a and forming a conductive film 120b having a substantially constant thickness after the operation of arranging the conductive film 120a. As shown in FIG. 6, the conductive film 120b may include a conductive layer $120a_1\_1$ and a protective layer $120a_2$ disposed on the conductive layer $120a_1\_1$.

The operation of compressing the conductive film 120a and forming the conductive film 120b having the substantially constant thickness may be performed using a transparent compression tool 700 disposed on the conductive film 120a. The transparent compression tool 700 may be directly disposed on the protective layer $120a_2$ of the conductive film 120b.

The transparent compression tool 700 may include a transparent material such as quartz or glass. For example, the compression tool 700 may be a block made of quartz, glass or the like.

The conductive film 120a formed on the ground first side surface of the first substrate 100, the ground first side surface 200s of the second substrate 200, and the ground first side surfaces 110s of the plurality of connection lines 110 may be compressed downward in the first direction DR1 using the transparent compression tool 700. The conductive layer 120a₁_1 of the compressed conductive film 120b may uniformly spread in the second direction DR2 and the third direction DR3 and have a substantially constant thickness in the first direction DR1.

In the method of manufacturing a display device according to an exemplary embodiment of the present invention, the operation of transferring the conductive film 120b to the ground first side surface of the first substrate 100, the ground first side surface 200s of the second substrate 200, and the ground first side surfaces 110s of the plurality of connection lines 110 may be performed substantially simultaneously with the operation of laser-curing the conductive film 120a on the ground first side surface of the first substrate 100, the ground first side surface 200s of the second substrate 200, and the ground first side surfaces 110s of the plurality of connection lines 110.

As shown in FIG. 5, the operation of laser-curing the conductive film 120a may be performed such that laser beams are projected to pass through the transparent compression tool 700.

It will be understood that when the operation of transferring the conductive film 120b to the ground first side surface of the first substrate 100, the ground first side surface 200s of the second substrate 200, and the ground first side surfaces 110s of the plurality of connection lines 110, the operation is referred to as being performed substantially simultaneously with the operation of laser-curing the conductive film 120a on the ground first side surface of the first substrate 100, the ground first side surface 200s of the second substrate 200, and the ground first side surfaces 110s of the plurality of connection lines 110. An operation of forming the conductive film 120a may be performed first, and then the operation of compressing the conductive film 120a, which is formed on the ground first side surface of the first substrate 100, the ground first side surface 200s of the second substrate 200, and the ground first side surfaces 110s of the plurality of connection lines 110, downward in the first direction DR1 using the transparent compression tool 700 may be performed substantially simultaneously with the operation of laser-curing the conductive film 120a on the ground first side surface of the first substrate 100, the ground first side surface 200s of the second substrate 200, and the ground first side surfaces 110s of the plurality of connection lines 110.

For example, the operation of compressing the conductive film 120a, which is formed on the ground first side surface of the first substrate 100, the ground first side surface 200s of the second substrate 200, and the ground first side surfaces 110s of the plurality of connection lines 110, downward in the first direction DR1 using the transparent compression tool 700 may be performed before or after the operation of laser-curing the conductive film 120a on the ground first side surface of the first substrate 100, the ground first side surface 200s of the second substrate 200, and the ground first side surfaces 110s of the plurality of connection lines 110 in a temporal sequence.

For example, the operation of compressing the conductive film 120a, which is formed on the ground first side surface of the first substrate 100, the ground first side surface 200s of the second substrate 200, and the ground first side surfaces 110s of the plurality of connection lines 110, downward in the first direction DR1 using the transparent compression tool 700 and simultaneously curing the conductive film 120a such that laser beams are projected to pass through the transparent compression tool 700 may be performed. However, when the laser beams reach the conductive film 120a by passing through the transparent compression tool 700 and the transparent compression tool 700 compresses the conductive film 120a, it may also be possible that the operation of curing the conductive film 120a is performed before the operation of compressing the conductive film 120a in a temporal sequence. However, even if the operations are performed in the temporal sequence, since the operation of compressing the conductive film 120a using the transparent compression tool 700 is performed during the same process as the operation of curing the conductive film 120a using laser beams that have effectively transmitted through the transparent compression tool 700, the two operations are performed substantially simultaneously.

The operation of laser-curing the conductive film 120a may be performed using a first laser supply device 800. The first laser supply device 800 may be a continuous wave (CW) laser supply device.

The operation of laser-curing the conductive film 120a may be performed when a focus of laser beams is positioned at a front surface of the conductive film 120a, which is a front surface (e.g., a top surface) viewed in the first direction DR1. For example, a focal position of the laser beams projected by the first laser supply device 800 may be adjusted such that the laser beams are projected onto the front surface of the conductive film 120a, which is viewed in the first direction DR1.

Thereafter, referring to FIG. 7, the protective layer 120a₂ may be delaminated and removed from one surface of the conductive layer 120a₁_1. Thus, the one surface of the conductive layer 120a₁_1 may be exposed to the outside.

Figure 8:
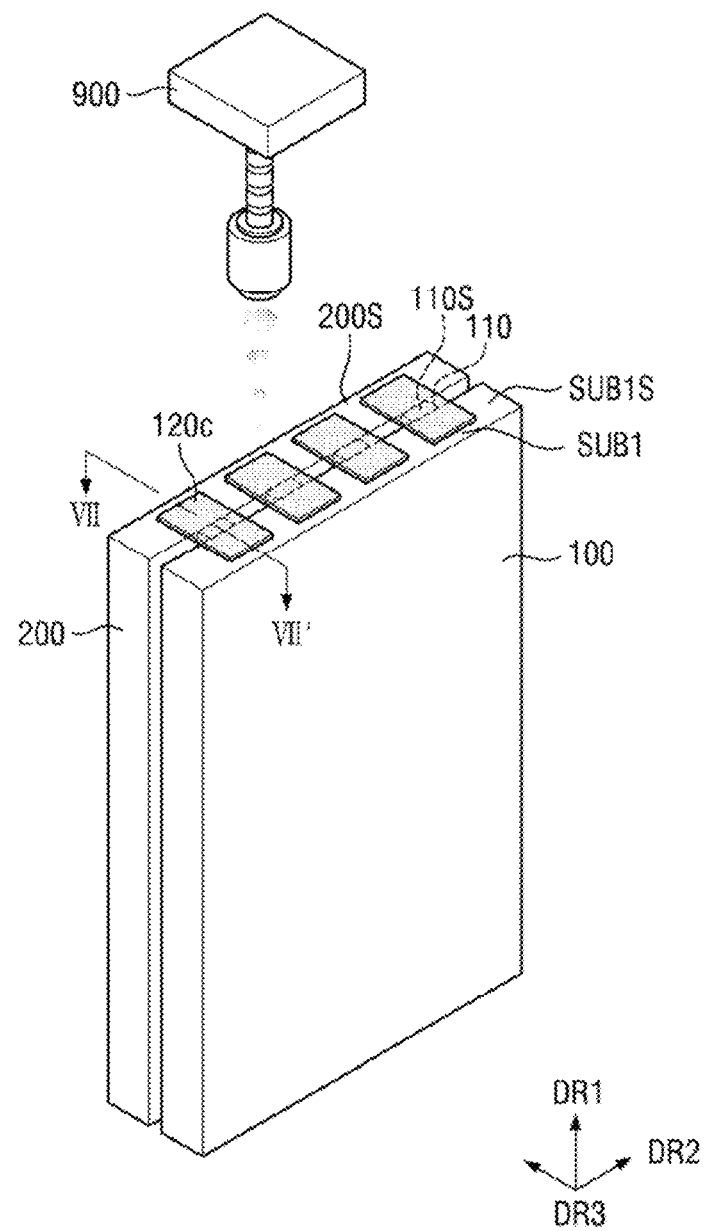
Figure 9:
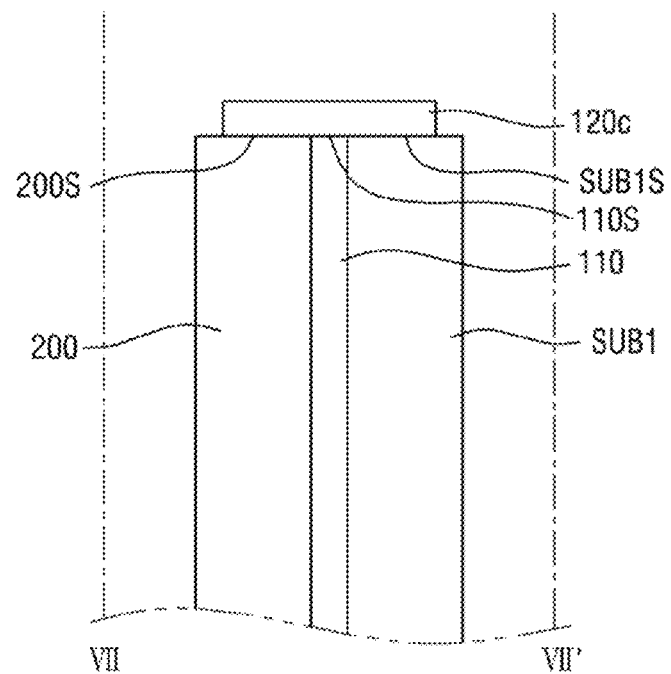
FIG. 9 is a cross-sectional view taken along line VII-VII' of FIG. 8.

Thereafter, referring to FIGS. 1, 8, and 9, the conductive layer 120a₁_1 may be patterned to form a plurality of connection pads 120c which are disposed separately from each other in one direction (S40). For example, the plurality of connection pads 120c may be spaced apart from each other along the second direction DR2.

As shown in FIG. 8, the operation S40 of forming the plurality of connection pads 120c, which are disposed separately from each other in one direction, by patterning the conductive layer 120a₁_1 may be performed using a second laser supply device 900.

The second laser supply device 900 may be different from a CW laser supply device. For example, laser beams projected by the second laser supply device 900 may have a pulse generated at a constant repetitious rate in a predetermined period of time. For example, the second laser supply device 900 may be a short-pulse laser supply device configured to provide short-pulse laser.

Due to the second laser supply device 900, as shown in FIG. 8, the conductive layer 120a1_1 may be formed as the plurality of connection pads 120c disposed to be spaced apart from each other in the second direction DR2.

Each of the connection pads 120c may be electrically connected to the corresponding one of the connection lines 110 in the first direction DR1. For example, each of the connection pads 120c may be disposed on a corresponding connection line 110.

Referring to FIGS. 1 and 10 to 12, a printed circuit board (PCB) 300 may be bonded onto the plurality of connection pads 120c (S50).

The operation S50 of bonding the PCB 300 onto the plurality of connection pads 120c may include arranging the PCB 300 on the plurality of connection pads 120c and compressing the arranged PCB 300 and laser-bonding the PCB 300 to the plurality of connection pads 120c.

The PCB 300 may include a base film 310, the plurality of connection lines 110, and a plurality of lead lines 330, each of which correspond to and are electrically connected to one of the plurality of connection pads 120c. The PCB 300 may further include a driver integrated circuit (IC) 390 electrically connected to the plurality of lead lines 330.

The PCB 300 may be a flexible film such as a flexible PCB, a PCB, or a chip-on film (COF).

The driver IC 390 may be, for example, a data driver IC, and a COF implemented as a data driver chip may be applied to the driver IC 390.

Figure 10:
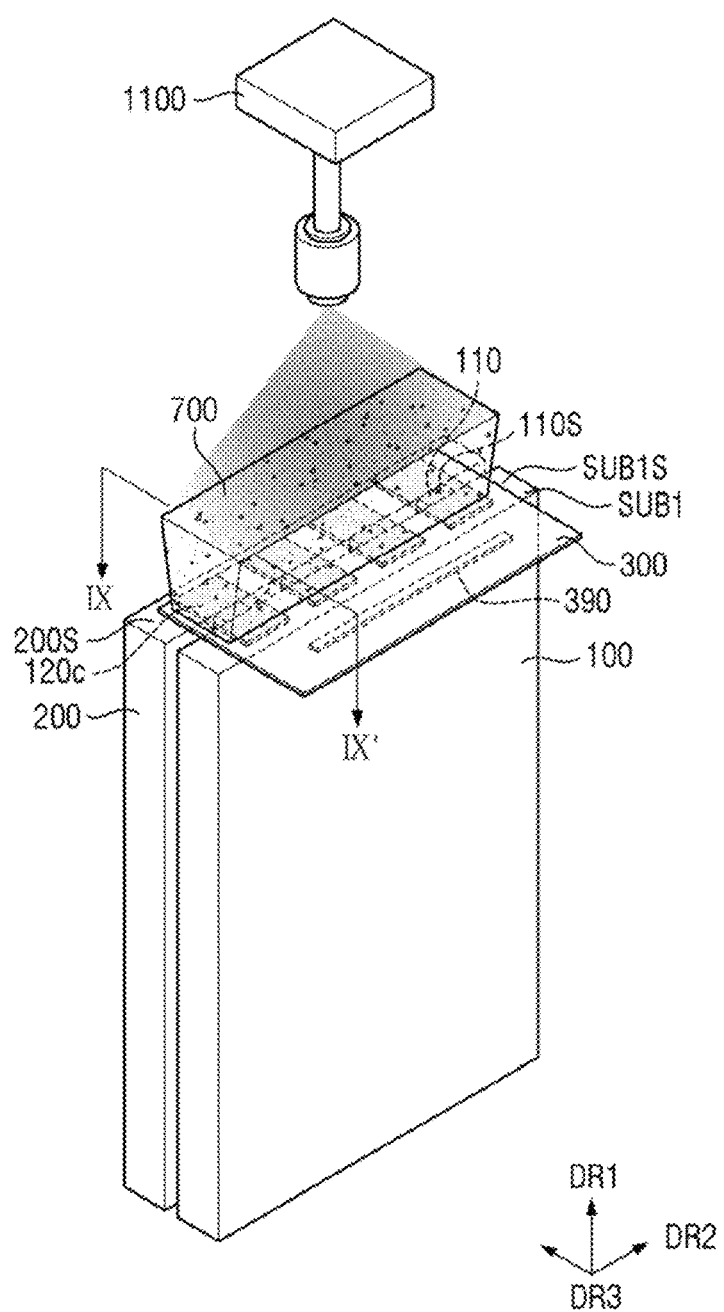

Although FIG. 10 illustrates a case in which the PCB 300 is bonded only to the first side surfaces of the target panels 100 and 200, the present invention is not limited thereto. The PCB 300 may be disposed on the first side surfaces of the target panels 100 and 200 and at least one of other side surfaces (e.g., the lower short side portions in the first direction DR1, a long side portion of one side in the second direction DR2, and a long side portion of the other side in the second direction DR2) of the target panels 100 and 200.

As shown in FIG. 10, the operation of compressing the disposed PCB 300 may be performed using a transparent compression tool 1000 disposed on the PCB 300. The transparent compression tool 1000 may be substantially the same as the transparent compression tool 700 described above with reference to FIG. 5.

Referring to FIG. 11, an anisotropic conductive film 130 may be further disposed between the lead lines 330 and the connection pads 120c. As shown in FIG. 12, the anisotropic conductive film 130 may include a plurality of conductive balls 130b configured to electrically connect the lead lines 330 to the connection pads 120c and an insulating resin 130a in which the plurality of conductive balls 130b are disposed.

The operation of compressing the disposed PCB 300 may include compressing the anisotropic conductive film 130 by pressing the transparent compression tool 1000 downward in the first direction DR1 and bonding and electrically connecting the lead lines 330 to the connection pads 120c.

In the method of manufacturing a display device according to an exemplary embodiment of the present invention, the operation of compressing the disposed PCB 300 may be performed substantially simultaneously with the operation of laser-bonding the disposed PCB 300 to the connection pads 120c.

The operation of laser-bonding the PCB 300 may be performed such that laser beams are projected to pass through the transparent compression tool 1000.

Due to the operation of laser-bonding the PCB 300, the anisotropic conductive film 130 interposed between the PCB 300 and the connection pads 120c may be cured, and thus the PCB 300 may be bonded onto the connection pads 120c.

The operation of laser-bonding the PCB 300 may be performed using a third laser supply device 1100. The third laser supply device 1100 may be a CW laser supply device. The third laser supply device 1100 may have substantially the same configuration as the first laser supply device 800.

After the PCB 300 is bonded onto the connection pads 120c, as shown in FIG. 11, the PCB 300 may be bent onto another surface of the first substrate 100 (or a second surface SUB1b of the first base substrate SUB1). For example, the other surface of the first substrate 100 may be facing away from the second substrate 200.

In the method of manufacturing a display device according to an exemplary embodiment of the present invention, since the conductive film 120a is laser-cured, a curing rate of the conductive film 120b (e.g., a curing rate of the conductive layer of the conductive film 120b) may be higher than when the conductive film 120a is thermally cured. When the curing rate of the conductive layer is high, a resistance of the conductive layer may be lower than a resistance of a conductive layer formed using a thermal curing process.

FIG. 13 is a table showing comparisons between simultaneous operations of transferring a conductive film and laser-curing the conductive film and sequential operations of transferring a conductive film and laser-curing the conductive film in terms of process specifications.

Referring to FIG. 13, a left column represents specifications of a process of laser-curing a conductive film 120a after transferring the conductive film 120a, while a right column represents specifications of a process of simultaneously transferring a conductive film 120a and laser-curing the conductive film 120a.

To describe the left column, the transferring of the conductive film 120a was performed using a hot metal tool. During the compression of the hot metal tool, a temperature was about 100° C., a compression pressure was about 2 kgf, and a compression time was about ten seconds. Further, the curing of the conductive film 120a was performed using a laser supply device having an output of about 29.6 W. An output speed of the laser supply device was about 15 mm/s, and a process time taken for the curing process was about four seconds.

In the right column, a compression pressure was 2 kgf, and the curing of the conductive film 120a was performed using a laser supply device having an output of about 35 W, and compression and curing times were about five seconds.

When the operations of compressing and curing the conductive film 120a were simultaneously performed under conditions corresponding to the right column, an overall process time was reduced more than when the operations of the compressing and curing the conductive film 120a were performed separately.

Hereinafter, an exemplary embodiment of the present invention will be described. In the following embodiment, the same components as in the above-described embodiment may be denoted by the same reference numerals, and thus descriptions thereof may be omitted or simplified for brevity.

Figure 14:
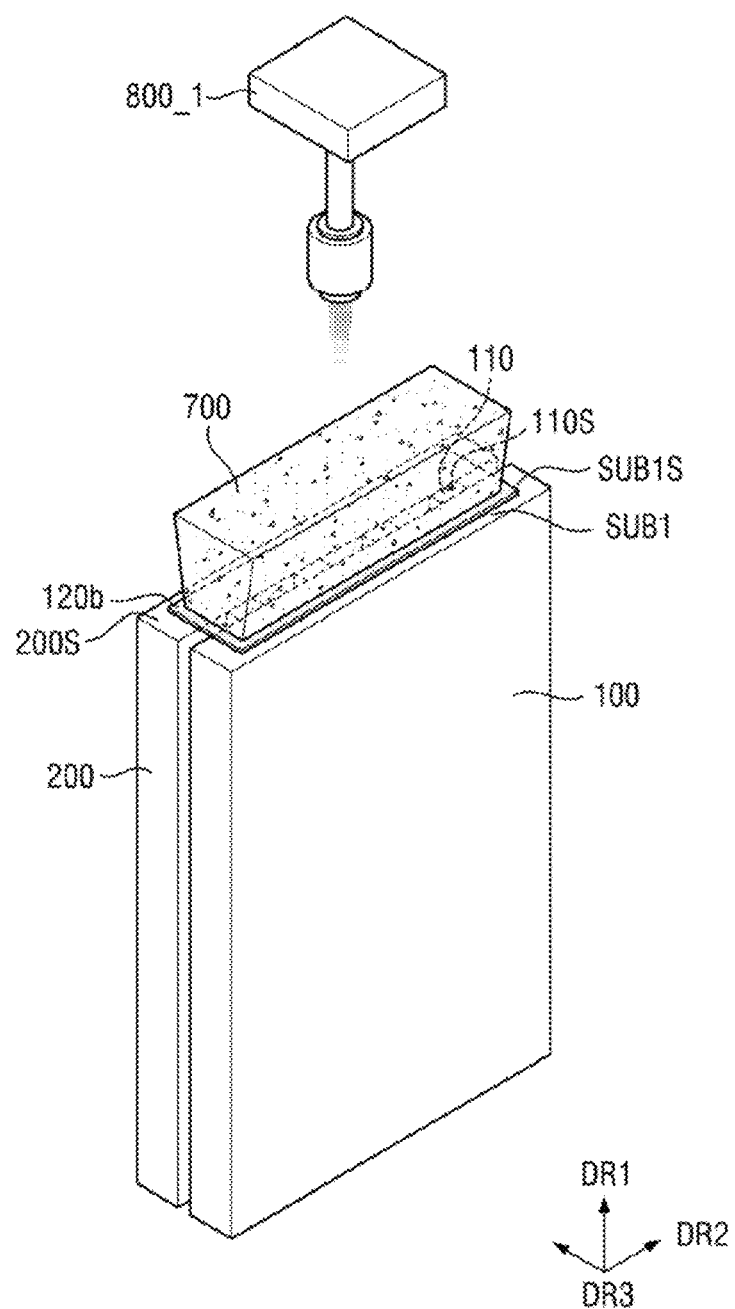
FIG. 14 is a perspective view of one process operation of a method of manufacturing a display device according to an exemplary embodiment of the present invention.

FIG. 14 is a perspective view of one process operation of a method of manufacturing a display device according to an exemplary embodiment of the present invention.

Referring to FIG. 14, the method of manufacturing a display device according to the present exemplary embodiment may be different from the method of manufacturing a display device according to the exemplary embodiment shown in FIG. 5 in that an operation of laser-curing a conductive film 120a. is performed using a first laser supply device 800_1.

Like the first laser supply device 800 of FIG. 5, a first laser supply device 800_1 may be a CW laser supply device.

During the operation of laser-curing the conductive film 120a according to the present embodiment, a focus of laser beams is positioned at a partial region of the conductive film 120a, which is viewed from a first direction DR1. For example, a focal position of the laser beams projected by the first laser supply device 800_1 may be adjusted such that the laser beams are projected onto the partial region of the conductive film 120a. The focal position of the laser beams of the first laser supply device 800_1 may be changed. For example, the focal position of the laser beams of the first laser supply device 800_1 may be changed such that the laser beams are projected onto a front surface of the conductive film 120a.

The changed focal position may form a line shape based on the drawings, but the present invention is not limited thereto.

Figure 15:
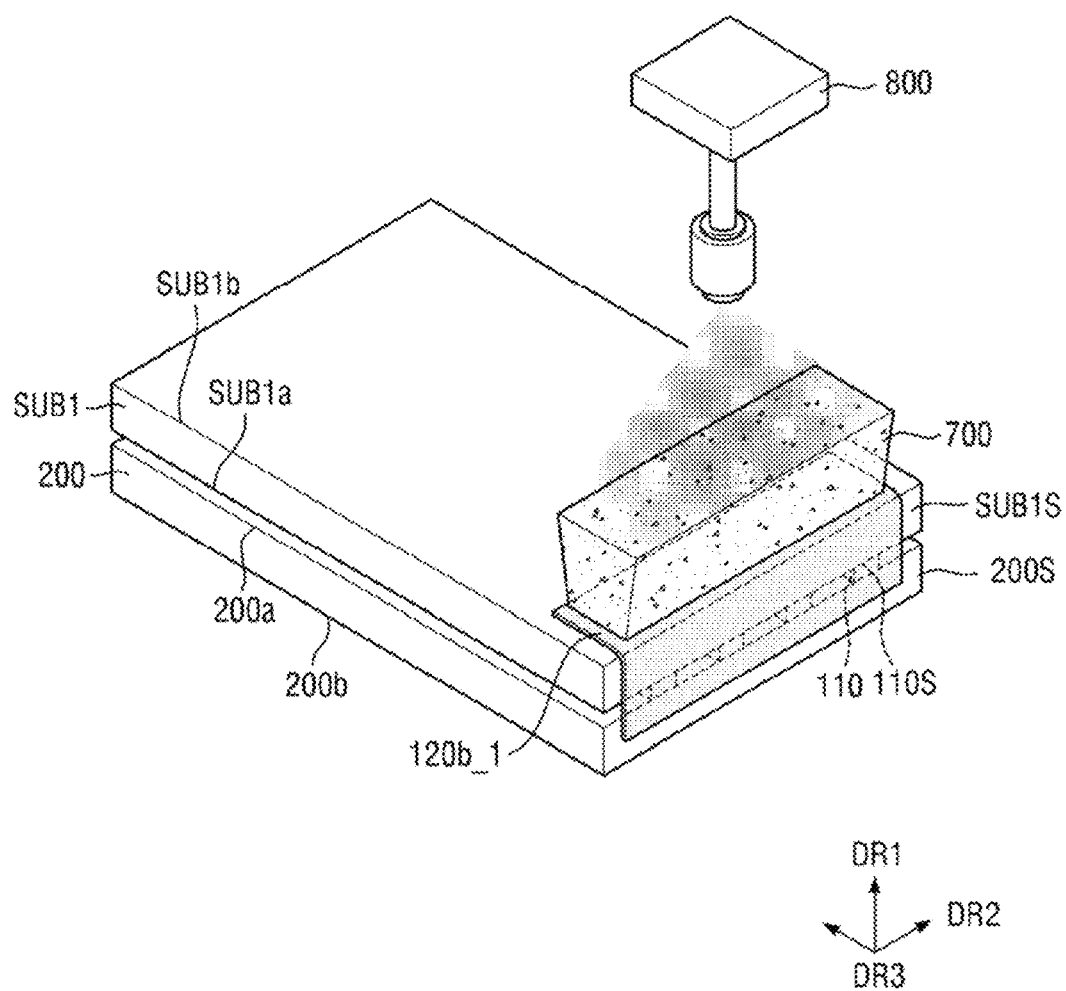
FIG. 15 is a perspective view of one process operation of a method of manufacturing a display device according to an exemplary embodiment of the present invention.

FIG. 15 is a perspective view of one process operation of a method of manufacturing a display device according to an exemplary embodiment of the present invention.

Referring to FIG. 15, the method of manufacturing a display device according to the present exemplary embodiment may be different from the method according to the exemplary embodiment shown in FIG. 5 in that a conductive film 120b_1 extends to a second surface SUB1b of a first base substrate SUB1 from the first side surface SUB1s of the first base substrate SUB1. In addition, the conductive film 120b_1 is compressed and laser-cured on the second surface SUB1b of the first base substrate SUB1.

Hereinafter, other descriptions thereof, which are substantially the same as in FIGS. 4 and 5, may be omitted for brevity.

Figure 16:
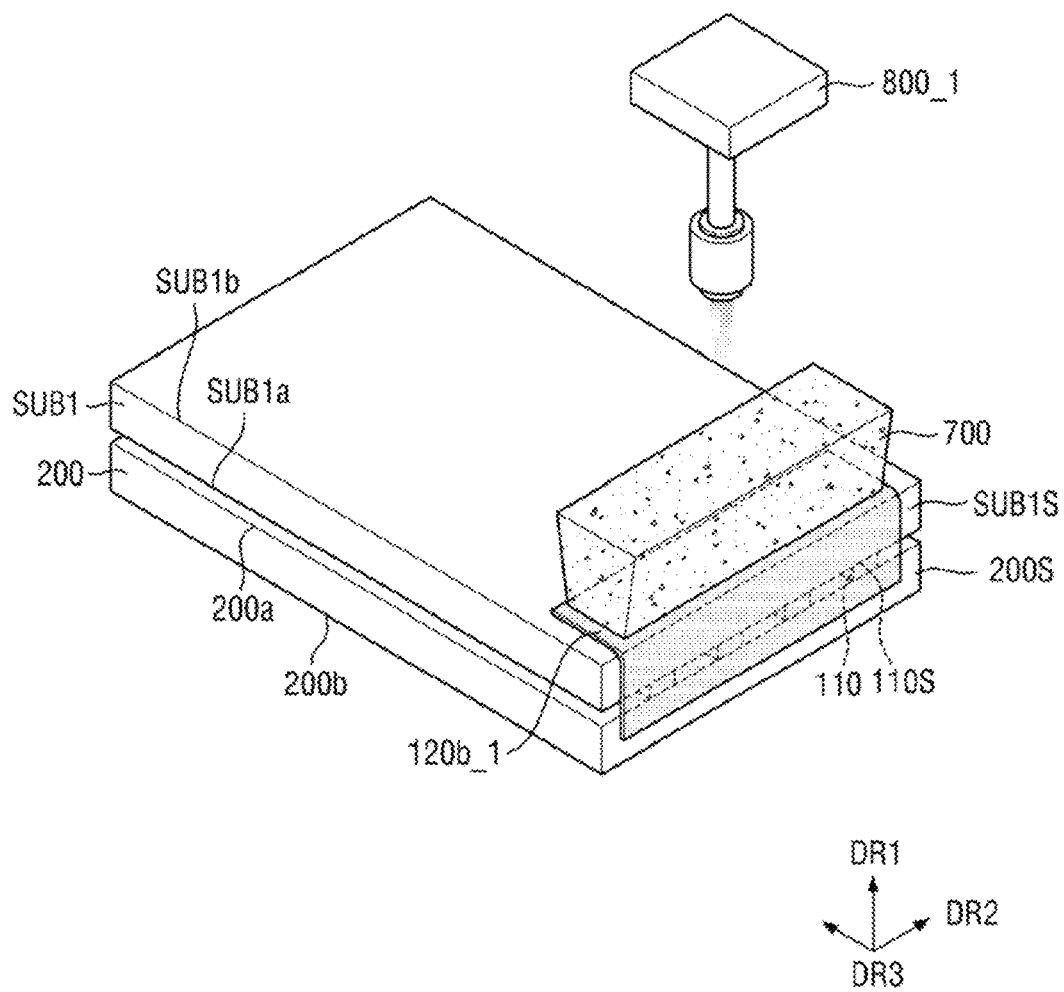
FIG. 16 is a perspective view of one process operation of a method of manufacturing a display device according to an exemplary embodiment of the present invention.

FIG. 16 is a perspective view of one process operation of a method of manufacturing a display device according to an exemplary embodiment of the present invention.

Referring to FIG. 16, the method of manufacturing a display device according to the present exemplary embodiment may be different from the method according to the exemplary embodiments shown in FIG. 15 in that an operation of laser-curing a conductive film is performed using a first laser supply device 800_1. For example, during the operation of the laser-curing of the conductive film, the first laser supply device 800_1, shown in FIG. 16, focuses laser beams to a partial region of the conductive film 120b_1. Referring to FIG. 15, the first laser supply device 800 provides laser beams to a surface, facing in the first direction DR1, of the conductive film 120b_1.

Hereinafter, other descriptions which are substantially the same as in FIGS. 4, 5, 14, and 15 may be omitted for brevity.

Hereinafter, a manufacturing device of a display device will be described. In the following exemplary embodiment of the present invention, the same components as in the above-described embodiment may be denoted by the same reference numerals, and descriptions thereof may be omitted or simplified for brevity.

Figure 17:
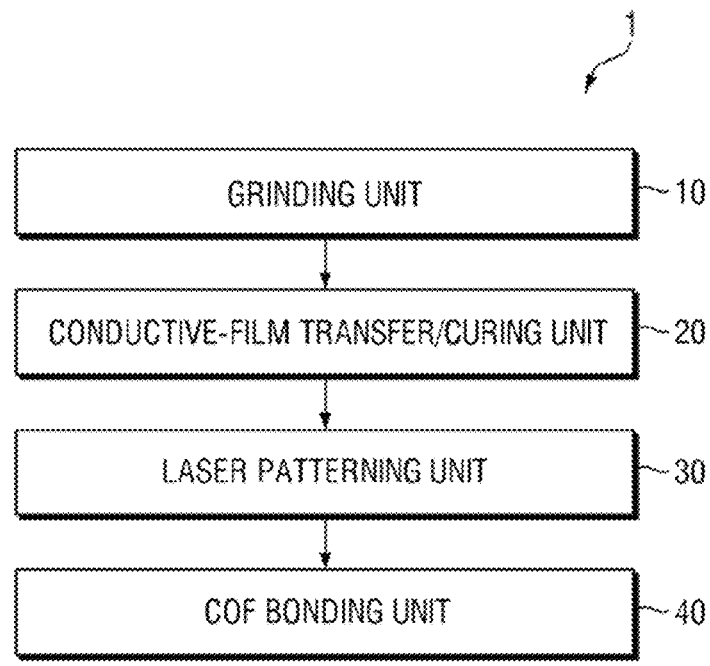
FIG. 17 is a block diagram of a manufacturing device for a display device according to an exemplary embodiment of the present invention.
Figure 18:
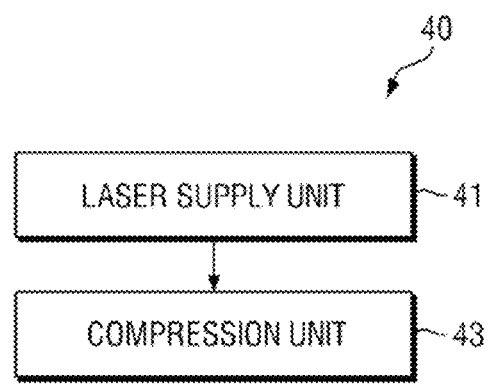
FIG. 18 is a block diagram of a chip-on film (COF) bonding unit according to an exemplary embodiment of the present invention.

FIG. 17 is a block diagram of a manufacturing device of a display device according to an exemplary embodiment of the present invention, and FIG. 18 is a block diagram of a COF bonding unit according to an exemplary embodiment of the present invention.

The manufacturing device 1 of a display device according to the exemplary embodiment may include a grinding unit 10 (e.g., a grinder), a conductive-film transfer/curing unit 20, a laser patterning unit 30, and a COF bonding unit 40.

The grinding unit 10 may have the same configuration as the grinding device 600 described above with reference to FIG. 2. The conductive-film transfer/curing unit 20 may have components that each are the same as a corresponding one of the transparent compression tool 700 and the first laser supply device 800 of FIG. 5. The laser patterning unit 30 may have the same configuration as the second laser supply device 900 of FIG. 8. The COF bonding unit 40 may have components that each are the same as a corresponding one of the transparent compression tool 1000 and the third laser supply device 1100 of FIG. 10.

The grinding unit 10 may grind one side surface SUB1s of a first base substrate SUB1, one side surface 200s of a second substrate 200 facing the first base substrate SUB1, and side surfaces 110s of a plurality of connection lines 110 disposed between the first base substrate SUB1 and the second substrate 200.

The conductive-film transfer/curing unit 20 may simultaneously transfer and laser-cure a conductive film 120a on the ground side surface SUB1s of the first base substrate SUB1, the ground side surface 200s of the second substrate 200 facing the first base substrate SUB1, and the ground side surfaces 110s of the plurality of connection lines 110 disposed between the first base substrate SUB1 and the second substrate 200. Here, the conductive film 120a may include a conductive layer $120a_1$ and a protective layer $120a_2$ disposed on the conductive layer $120a_1$.

A conductive-film transfer unit 20 may be formed to compress the conductive film 120a, which is formed on the ground side surface SUB1s of the first base substrate SUB1, the ground side surface 200s of the second substrate 200 facing the first base substrate SUB1, and the ground side surfaces 110s of the plurality of connection lines 110 disposed between the first base substrate SUB1 and the second substrate 200. The conductive-film transfer unit 20 may include a transparent compression tool 700 disposed on the conductive film 120a, and the transparent compression tool 700 may include, for example, quartz or glass.

A conductive-film curing unit 20 may include a laser supply device 800. The laser supply device 800 may be configured to project CW laser beams which pass through the transparent compression tool 700 to cure the conductive film 120a.

The laser patterning unit 30 may pattern the conductive layer $120a_1$ and form connection pads 120c. The COF bonding unit 40 may bond a PCB onto the connection pads 120c. The COF bonding unit 40 may include a compression unit 43 configured to compress a COF (refer to PCB 300 in FIG. 10), and a laser supply unit 41 configured to project laser beams which pass through the compression unit 43 and cure an anisotropic conductive film 130 disposed between lead lines 330 of the PCB and the connection pads 120c. The compression unit 43 may be the same as the conductive-film transfer unit 20, and the laser supply unit 41 may be the same as the conductive-film curing unit 20.

The method of manufacturing a display device and the manufacturing device for a display device according to an exemplary embodiment of the present invention can reduce a process time taken for a process of transferring and curing connection pads.

Effects according to the present invention are not limited by the above-described examples, and more various effects may be included in the present invention.

While the present invention has been described with reference to exemplary embodiments thereof, it will be understood by those of ordinary skill in the art that various changes in form and details may be made thereto without departing from the spirit and scope of the present invention.

What is claimed is:

1. A manufacturing device for a display device, the device comprising:
   a grinder configured to grind a side surface of a base substrate, a side surface of a second substrate, and side surfaces of a plurality of connection lines disposed between the base substrate and the second substrate; and a conductive-film transfer unit and a conductive-film curing unit configured to simultaneously perform a formation process of a conductive film and laser-cure the conductive film, wherein the formation process of the conductive film comprises forming the conductive film on the ground side surface of the base substrate and the ground side surfaces of the plurality of connection lines, and compressing the conductive film wherein the conductive film comprises a conductive layer and a protective layer disposed on the conductive layer.

2. The device of claim 1, wherein the conductive-film transfer unit compresses the conductive film formed on the ground side surface of the base substrate, the ground side surface of the second substrate, and the ground side surfaces of the plurality of connection lines.

3. The device of claim 2, wherein the conductive-film transfer unit comprises a first compression tool disposed on the conductive film, and the first compression tool comprises quartz or glass.

4. The device of claim 3, wherein the conductive-film curing unit comprises a first laser supply device, wherein the first laser supply device projects continuous-wave laser beams through the first compression tool and cures the conductive film.

5. The device of claim 4, further comprising:

a patterning laser configured to pattern the conductive layer and form connection pads; and a chip-on film bonding unit configured to bond a printed circuit board comprising a chip-on film onto the connection pads, wherein the chip-on film bonding unit comprises:

a compression unit configured to compress the chip-on film and comprising a second compression tool including quartz or glass; and a second laser supply device configured to project laser beams through the compression unit and to cure an anisotropic conductive film disposed between lead lines of the printed circuit board and the connection pads.

* * * * *